United States Patent
Kumar et al.

(10) Patent No.: US 9,929,283 B1
(45) Date of Patent: Mar. 27, 2018

(54) JUNCTION FIELD EFFECT TRANSISTOR (JFET) WITH FIRST AND SECOND TOP LAYER OF OPPOSITE CONDUCTIVITY TYPE FOR HIGH DRIVING CURRENT AND LOW PINCH-OFF VOLTAGE

(71) Applicant: Vanguard International Semiconductor Corporation, Hsinchu (TW)

(72) Inventors: Manoj Kumar, Dhanbad (IN);
Wen-Hsin Lin, Jhubei (TW);
Shin-Cheng Lin, Tainan (TW);
Chia-Hao Lee, New Taipei (TW);
Chih-Cherng Liao, Jhudong Township (TW)

(73) Assignee: Vanguard International Semiconductor Corporation, Hsinchu (TW)

( * ) Notice: Subject to any disclaimer, the term of this patent is extended or adjusted under 35 U.S.C. 154(b) by 0 days.

(21) Appl. No.: 15/450,807

(22) Filed: Mar. 6, 2017

(51) Int. Cl.
| | |
|---|---|
| *H01L 29/808* | (2006.01) |
| *H01L 29/66* | (2006.01) |
| *H01L 29/06* | (2006.01) |
| *H01L 29/417* | (2006.01) |
| *H01L 23/535* | (2006.01) |
| *H01L 21/265* | (2006.01) |
| *H01L 21/768* | (2006.01) |
| *H01L 21/8234* | (2006.01) |

(52) U.S. Cl.
CPC ........ *H01L 29/8086* (2013.01); *H01L 21/265* (2013.01); *H01L 21/76895* (2013.01); *H01L 21/823493* (2013.01); *H01L 23/535* (2013.01); *H01L 29/0653* (2013.01); *H01L 29/41775* (2013.01); *H01L 29/66893* (2013.01)

(58) Field of Classification Search
CPC ............. H01L 29/8086; H01L 29/0653; H01L 29/41775; H01L 29/66893; H01L 21/265; H01L 21/823493; H01L 23/535
See application file for complete search history.

(56) References Cited

U.S. PATENT DOCUMENTS

| | | | |
|---|---|---|---|
| 5,412,234 A * | 5/1995 | Schoofs | H01L 27/0629 257/256 |
| 8,704,300 B1 | 4/2014 | Lin et al. | |
| 9,190,536 B1 * | 11/2015 | Chan | H01L 29/1058 |
| 2008/0258182 A1 | 10/2008 | Agarwal et al. | |

(Continued)

*Primary Examiner* — Andrew Q Tran
(74) *Attorney, Agent, or Firm* — Birch, Stewart, Kolasch & Birch, LLP

(57) ABSTRACT

A semiconductor device includes a semiconductor substrate, a first well region, and a second well region. The semiconductor substrate has a first conductivity type. The first and second well regions are disposed in the semiconductor substrate. The first and second well regions have a second conductivity type that is opposite to the first conductivity type. The semiconductor device also includes a first top layer and a second top layer. The first top layer is disposed in the semiconductor substrate. The first top layer extends from the first well region to the second well region. The first top layer has the first conductivity type. The second top layer is disposed in the semiconductor substrate and on the first top layer. The second top layer extends from the first well region to the second well region. The second top layer has the second conductivity type.

20 Claims, 7 Drawing Sheets

(56) References Cited

U.S. PATENT DOCUMENTS

2015/0243780 A1  8/2015  Lin et al.
2016/0043217 A1  2/2016  Cai
2016/0181369 A1  6/2016  Ning et al.

* cited by examiner

JUNCTION FIELD EFFECT TRANSISTOR (JFET) WITH FIRST AND SECOND TOP LAYER OF OPPOSITE CONDUCTIVITY TYPE FOR HIGH DRIVING CURRENT AND LOW PINCH-OFF VOLTAGE

BACKGROUND OF THE INVENTION

Field of the Invention

The invention relates to semiconductor devices, and in particular to semiconductor devices having two top layers with opposite conductivity types and methods for forming the same.

Description of the Related Art

In the semiconductor industry, there are two major classes of field effect transistors (FETs); namely the insulated gate field effect transistor (IGFET), which is more commonly known as a metal oxide semiconductor field effect transistor (MOSFET), and the junction field effect transistor (JFET). The MOSFET and the JFET are fundamentally different in composition. For example, the gate of the MOSFET includes an insulating layer, which is normally referred to as a gate oxide layer, between the gate and the other transistor electrodes. Therefore, the channel current in the MOSFET is controlled by the electric fields across the channel to enhance and deplete the channel region as required. The gate of the JFET forms a P-N junction with the other electrodes of the transistor, which can be reverse biased by applying a predetermined gate voltage. Accordingly, the gate P-N junction of the JFET can be utilized to control the channel current by varying the size of the depletion region in the channel.

In general, JFET can be used as a voltage-controlled resistor or as an electronically-controlled switch. A p-type JFET includes a channel of semiconductor material doped to have a large amount of positive charge carriers or holes, whereas an n-type JFET includes a channel of semiconductor material doped to have a large amount of negative charge carriers or electrons. At each end of the JFET, the source and drain are formed by Ohmic contacts, and the electric current flows through the channel between the source and the drain. Moreover, the electric current can be impeded or switched off, also known as a "pinch-off", by applying a reverse bias voltage to the gate.

Although existing JFETs of semiconductor devices and methods for forming the same have been adequate for their intended purposes, they have not been entirely satisfactory in all respects. Therefore, there are still some problems to be overcome in regards to the JFETs of semiconductor devices and technology.

BRIEF SUMMARY OF THE INVENTION

Generally, forming a semiconductor device that has both a high driving current and a low pinch-off voltage (which is ideal for switching applications) is the primary criteria in the development of semiconductor devices. In order to achieve the aforementioned criteria, an n-type top layer and a p-type top layer are implanted between the source and the drain in the semiconductor substrate. More specifically, a portion of the two top layers with opposite conductivity types is formed under the gate of the semiconductor device which can increase the driving current and decrease the pinch-off voltage of the device without forming a well region under the gate. Moreover, compared to the traditional manufacturing process, the embodiments of the present disclosure can form a semiconductor device with a high driving current and a low pinch-off voltage without using additional masks for forming additional circuits for the device in the overall process.

Embodiments of semiconductor devices and methods for forming the same are provided. In the following embodiments, the JFETs of semiconductor devices are provided as examples, however, the embodiments of the present disclosure are not limited to JFETs, and other applications of semiconductor devices may be included.

Some embodiments of the disclosure provide a semiconductor device. The semiconductor device includes a semiconductor substrate having a first conductivity type, and a first well region and a second well region disposed in the semiconductor substrate, wherein the first well region and the second well region have a second conductivity type that is opposite to the first conductivity type. The semiconductor device also includes a first top layer disposed in the semiconductor substrate, wherein the first top layer extends from the first well region to the second well region, and the first top layer has the first conductivity type. The semiconductor device further includes a second top layer disposed in the semiconductor substrate and on the first top layer, wherein the second top layer extends from the first well region to the second well region, and the second top layer has the second conductivity type.

Some embodiments of the disclosure provide a method for forming a semiconductor device. The method includes providing a semiconductor substrate having a first conductivity type, and forming a first well region and a second well region in the semiconductor substrate, wherein the first well region and the second well region have a second conductivity type that is opposite to the first conductivity type. The method also includes forming a first top layer in the semiconductor substrate, wherein the first top layer is formed extending from the first well region to the second well region, and the first top layer has the first conductivity type. The method further includes forming a second top layer in the semiconductor substrate and on the first top layer, wherein the second top layer is formed extending from the first well region to the second well region, and the second top layer has the second conductivity type.

A detailed description is given in the following embodiments with reference to the accompanying drawings.

BRIEF DESCRIPTION OF THE DRAWINGS

The disclosure can be more fully understood from the following detailed description when read with the accompanying figures. It is worth noting that, in accordance with standard practice in the industry, various features are not drawn to scale. In fact, the dimensions of the various features may be arbitrarily increased or reduced for clarity of discussion.

DETAILED DESCRIPTION OF THE INVENTION

Figure 1:
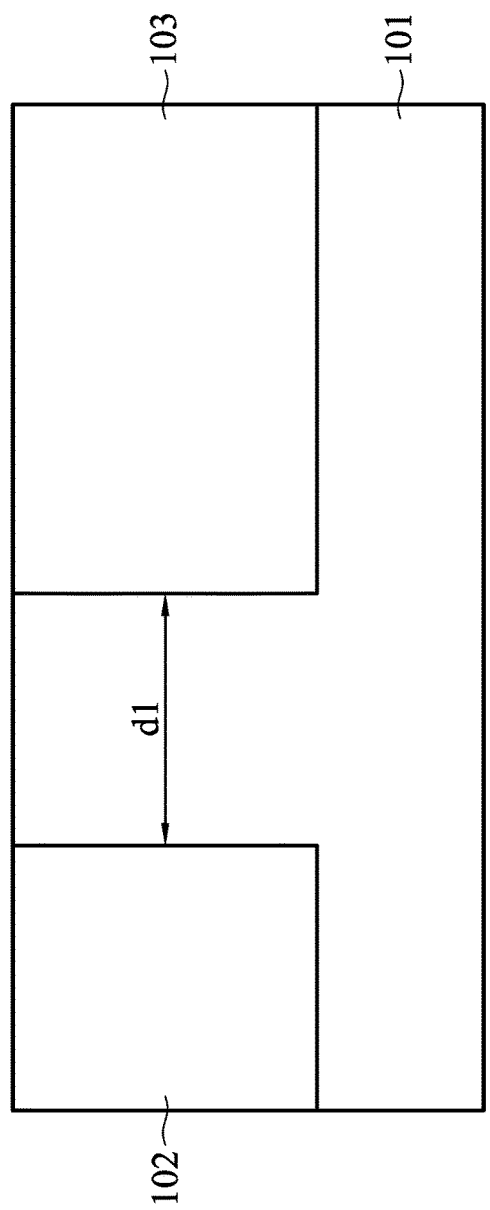
FIGS. 1 to 6 are cross-sectional views illustrating an exemplary sequential formation process of a semiconductor device in accordance with some embodiments.

The following disclosure provides many different embodiments, or examples, for implementing different features of the subject matter provided. Specific examples of components and arrangements are described below to simplify the present disclosure. These are, of course, merely examples and are not intended to be limiting. For example, the formation of a first feature over or on a second feature in the description that follows may include embodiments in which the first and second features are formed in direct contact, and may also include embodiments in which additional features may be formed between the first and second features, such that the first and second features may not be in direct contact. In addition, the present disclosure may repeat reference numerals and/or letters in the various embodiments. This repetition is for the purpose of simplicity and clarity and does not in itself dictate a relationship between the various embodiments and/or configurations discussed.

Some embodiments are described below. Throughout the various views and illustrative embodiments, like reference numbers are used to designate like features. It should be understood that additional operations can be provided before, during, and after the method, and some of the operations described can be replaced or eliminated for other embodiments of the method.

Embodiments for forming a semiconductor device are provided. FIGS. 1 to 6 are cross-sectional views illustrating an exemplary sequential forming process of the semiconductor device 100 shown in FIG. 6 in accordance with some embodiments.

As shown in FIG. 1, a first well region 102 and a second well region 103 are formed in a semiconductor substrate 101, in accordance with some embodiments. The semiconductor substrate 101 may be made of silicon or another semiconductor material. Alternatively, the semiconductor substrate 101 may include other elementary semiconductor materials such as germanium (Ge). In some embodiments, the semiconductor substrate 101 is made of a compound semiconductor such as silicon carbide (SiC), gallium nitride (GaN), gallium arsenic (GaAs), indium arsenide (InAs), or indium phosphide (InP). In some embodiments, the semiconductor substrate 101 is made of an alloy semiconductor such as silicon germanium, silicon germanium carbide, gallium arsenic phosphide, or gallium indium phosphide. In one embodiment, the semiconductor substrate 101 includes an epitaxial layer, for example, the semiconductor substrate 101 has an epitaxial layer overlying a bulk semiconductor. Moreover, the semiconductor substrate 101 may include a silicon-on-insulator (SOI) structure, for example, the semiconductor substrate 101 may include a buried oxide (BOX) layer (not shown). In the present embodiment for forming an n-type semiconductor device 100, the semiconductor substrate 101 is a lightly doped p-type substrate. In other embodiments, for example, for forming a p-type semiconductor device 100, the semiconductor substrate 101 may be a lightly doped n-type substrate.

More specifically, the first well region 102 and the second well region 103 are formed near the top surface of the semiconductor substrate 101, and separated by a distance d1. In some embodiments, the distance d1 is greater than 0 µm and not exceeding 15 µm. In some embodiments, the first well region 102 and the second well region 103 are formed by an ion implantation process using a patterned mask on the semiconductor substrate 101. In the present embodiment for forming a semiconductor device 100, for example, an n-type JFET, n-type dopants such as phosphorus (P) or arsenic (As), may be doped in the semiconductor substrate 101 to form the first well region 102 and the second well region 103. Alternatively, p-type dopants such as boron (B), may be doped in the semiconductor substrate 101 to form the first well region 102 and the second well region 103 for forming the semiconductor device 100 in other embodiments, for example, a p-type JFET. In the present embodiment for forming the semiconductor device 100, for example, an ultra-high voltage (UHV) n-type JFET, the first well region 102 and the second well region 103 are two deep high-voltage N-wells (DHVNW). In other embodiments for forming the semiconductor device 100, for example, an ultra-high voltage (UHV) p-type JFET, the first well region 102 and the second well region 103 may be two deep high-voltage P-wells (DHVPW).

It is should be noted that the distance d1 between the first well region 102 and the second well region 103 may influence the pinch-off voltage of the semiconductor device 100. The pinch-off voltage of the semiconductor device 100 may be decreased while increasing the distance d1, and vice versa.

Figure 2:
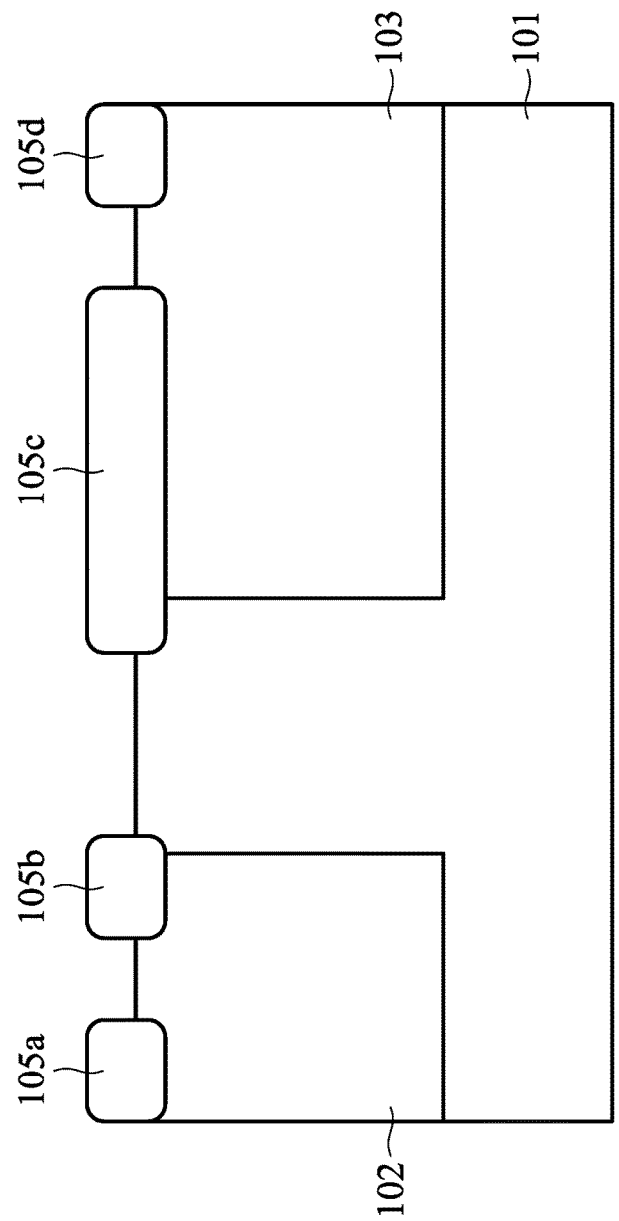

As shown in FIG. 2, some isolation structures 105a, 105b, 105c and 105d are formed on the semiconductor substrate 101, in accordance with some embodiments. The isolation structures 105a, 105b, 105c and 105d are illustrated as local oxidation of silicon (LOCOS) isolation structures, and portions of the isolation structures 105a, 105b, 105c and 105d are embedded in the semiconductor substrate 101. In other embodiments, the isolation structures 105a, 105b, 105c and 105d can be shallow trench isolation (STI).

In the present embodiment, there are four isolation structures 105a, 105b, 105c and 105d arranged sequentially on the semiconductor substrate 101, and the active region of the semiconductor device 100 is defined by the isolation structures 105a and 105d. It should be noted that the number of isolation structures per semiconductor device is not limited to four, and may be less or more.

More specifically, the isolation structures 105a and 105b are located on the first well region 102, and the isolation structures 105c and 105d are located on the second well region 103. Furthermore, a portion of the isolation structures 105b is located above the interface of the first well region 102 and the semiconductor substrate 101, and the source region of the semiconductor device 100 formed in the subsequent processes is located in the region defined by the two adjacent isolation structures 105a and 105b. In addition, a portion of the isolation structures 105c is located above the interface of the semiconductor substrate 101 and the second well region 103, and the drain region of the semiconductor device 100 formed in the subsequent processes is located in the region defined by the two adjacent isolation structures 105c and 105d.

In some embodiments, the aforementioned four isolation structures 105a, 105b, 105c and 105d are made of silicon oxide, silicon nitride, silicon oxynitride or another applicable dielectric material. In some embodiments, isolation structures 105a, 105b, 105c and 105d may be formed by thermal oxidation process, chemical vapor deposition process (CVD) or a combination thereof, depends on the types of the isolations. For examples, the STI structures can be formed by the following steps. An etching process is performed on the semiconductor substrate 101 by using masks to form trenches. Next, the trenches are filled with insulating material by performing a CVD process, and the insulating material outside of the trenches is then removed.

Figure 3:
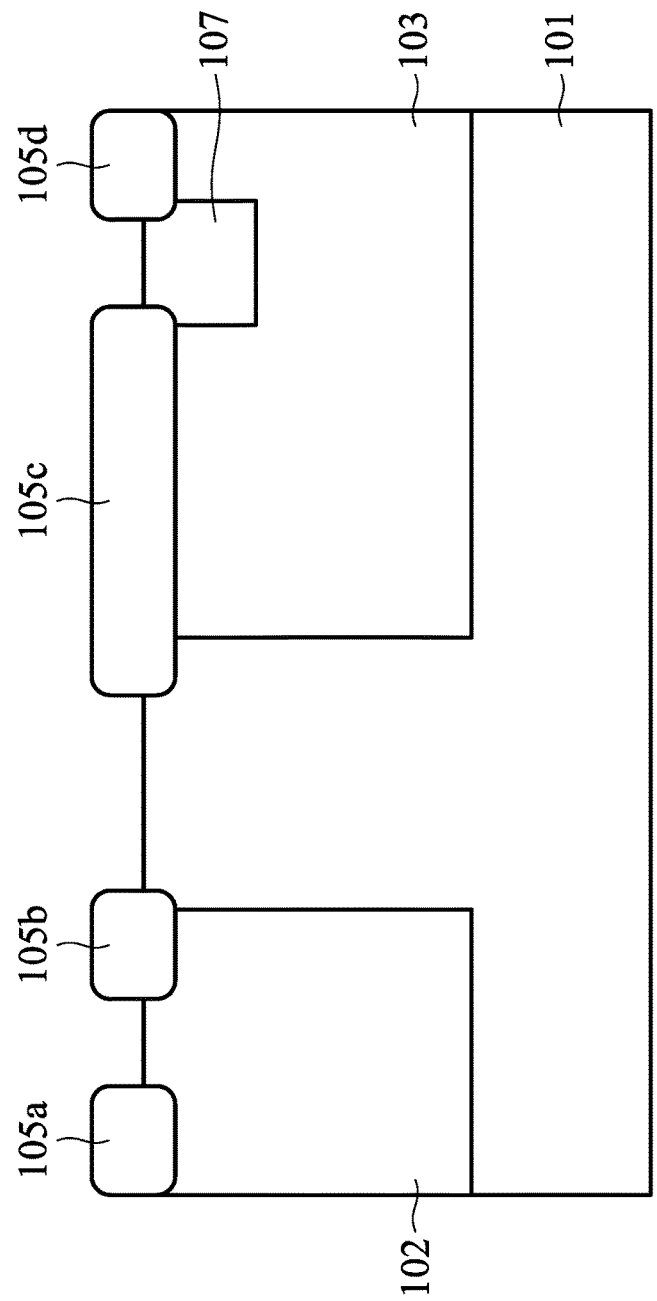

As shown in FIG. 3, a third well region 107 may be optionally formed in the region defined by the isolation structures 105c and 105d in the second well region 103, in accordance with some embodiments. The third well region 107 is formed to be narrower and shallower than the second well region 103, and the conductivity type of the third well region 107 is the same as that of the second well region 103. In the present embodiment of the n-type JFET, the third well region 107 is n-type. In some embodiments, the dopant concentration of the third well region 107 is higher than the dopant concentration of the second well region 103.

Figure 4:
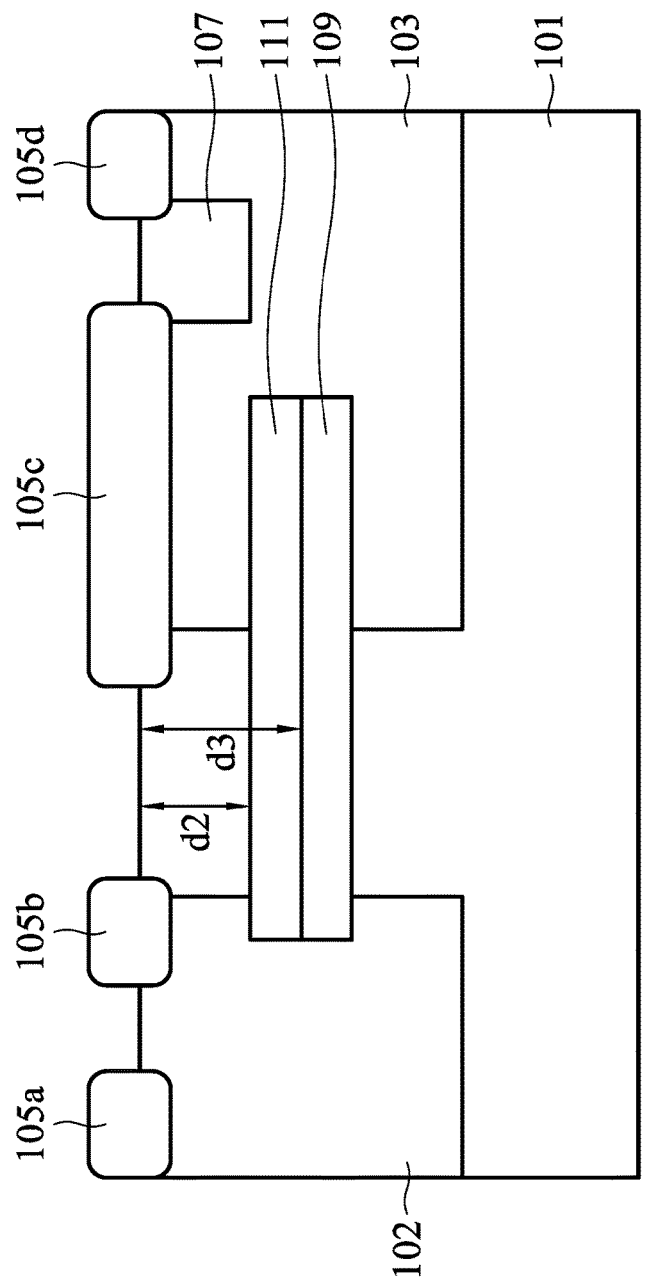

As shown in FIG. 4, a first top layer 109 is formed in the semiconductor substrate 101, and a second top layer 111 is formed in the semiconductor substrate 101 and on the first top layer 109, in accordance with some embodiments. It should be noted that the first top layer 109 and the second top layer 111 are formed extending from the first well region 102 to the second well region 103, with a first portion of the first top layer 109 (which is also the middle portion of the first top layer 109) and a first portion of the second top layer 111 (which is also the middle portion of the second top layer 111) located in the portion of the semiconductor substrate 101 between the first well region 102 and the second well region 103. In some embodiments, the distance d2 between the top surface of the semiconductor substrate 101 and the top surface of the second top layer 111 is in a range from about 0.2 mm to about 1 mm, and the distance d3 between the top surface of the semiconductor substrate 101 and the top surface of the first top layer 109 is in a range from about 2 mm to about 5 mm.

In some embodiments, a second portion of the first top layer 109 and a second portion of the second top layer 111 are located directly below the isolation structure 105b, and a third portion of the first top layer 109 and a third portion of the second top layer 111 are located directly below the isolation structure 105c. The second and third portions of the first top layer 109 refer to two opposite sides of the first top layer 109. Similarly, the second and third portions of the second top layer 111 refer to two opposite sides of the second top layer 111. In some embodiments, the second portion of the first top layer 109 and the second portion of the second top layer 111 are formed extending into the first well region 102. Similarly, the third portion of the first top layer 109 and the third portion of the second top layer 111 are formed extending into the second well region 103. It should be noted that the second top layer 111 and the isolation structure 105b are separated by a portion of the first well region 102, and the second top layer 111 and the isolation structure 105c are separated by a portion of the second well region 103.

In some embodiments, the first top layer 109 and the second top layer 111 are respectively formed by performing a first ion implantation process and a second ion implantation process in the first well region 102, the second well region 103, and the portion of the semiconductor substrate 101 between the first and second well regions 102 and 103. In some embodiments, the dopant concentrations of the first top layer 109 and the second top layer 111 are in a range from about $10^{15}$ atom/cm$^3$ to about $10^{17}$ atom/cm$^3$. It should be noted that, for a semiconductor device 100 such as an n-type JFET, the first top layer 109 is p-type, and the second top layer 111 is n-type. Conversely, for a semiconductor device 100 such as a p-type JFET, the first top layer 109 is n-type, and the second top layer 111 is p-type.

Figure 5:
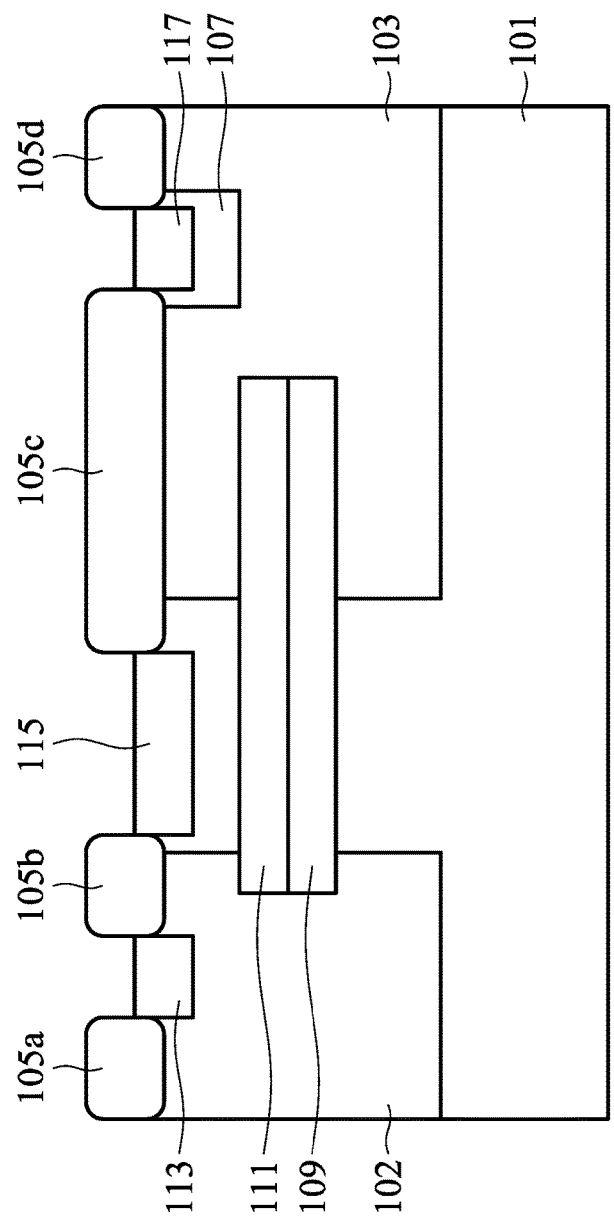

Next, as shown in FIG. 5, a source region 113 is formed in the first well region 102, a doped region 115 is formed in the portion of the semiconductor substrate 101 between the first well region 102 and the second well region 103, and a drain region 117 is formed in the second well region 103, in accordance with some embodiments. In some embodiments, the drain region 117 is formed in the third well region 107.

In some embodiments, the source region 113, the doped region 115 and the drain region 117 are formed by ion implantation processes. In some embodiments, the source region 113 and the drain region 117 are formed by an ion implantation process, and the doped region 115 is formed by another ion implantation process. Specifically, the conductivity type of the source region 113 is the same as that of the drain region 117, but different from the conductivity type of the doped region 115. In the present embodiment for forming a semiconductor device 100 such as an n-type JFET, the source region 113 and the drain region 117 are n-type, and the doped region 115 is p-type. In other embodiments, for example, for forming a semiconductor device 100 such as a p-type JFET, the source region 113 and the drain region 117 are p-type, and the doped region 115 is n-type.

Moreover, the dopant concentration of the source region 113, the doped region 115 and the drain region 117 are more than that of the first top layer 109, the second top layer 111, the first well region 102 and the second well region 103. In some embodiments, the dopant concentrations of the source region 113, the doped region 115 and the drain region 117 are in a range from about $1 \times 10^{18}$ atom/cm$^3$ to about $1 \times 10^{20}$ atom/cm$^3$.

As shown in FIG. 5, the first top layer 109 and the second top layer 111 are located between the source region 113 and the drain region 117, with the first portions of the first and second top layer 109 and 111 (the middle portions of the first and second top layer 109 and 111) located directly below the doped region 115. In some embodiments, the second top layer 111 and the doped region 115 are separated by a portion of the semiconductor substrate 101 between the first and second well regions 102 and 103. However, in other embodiments, the second top layer 111 may be in contact with the doped region 115 (not shown).

Figure 6:
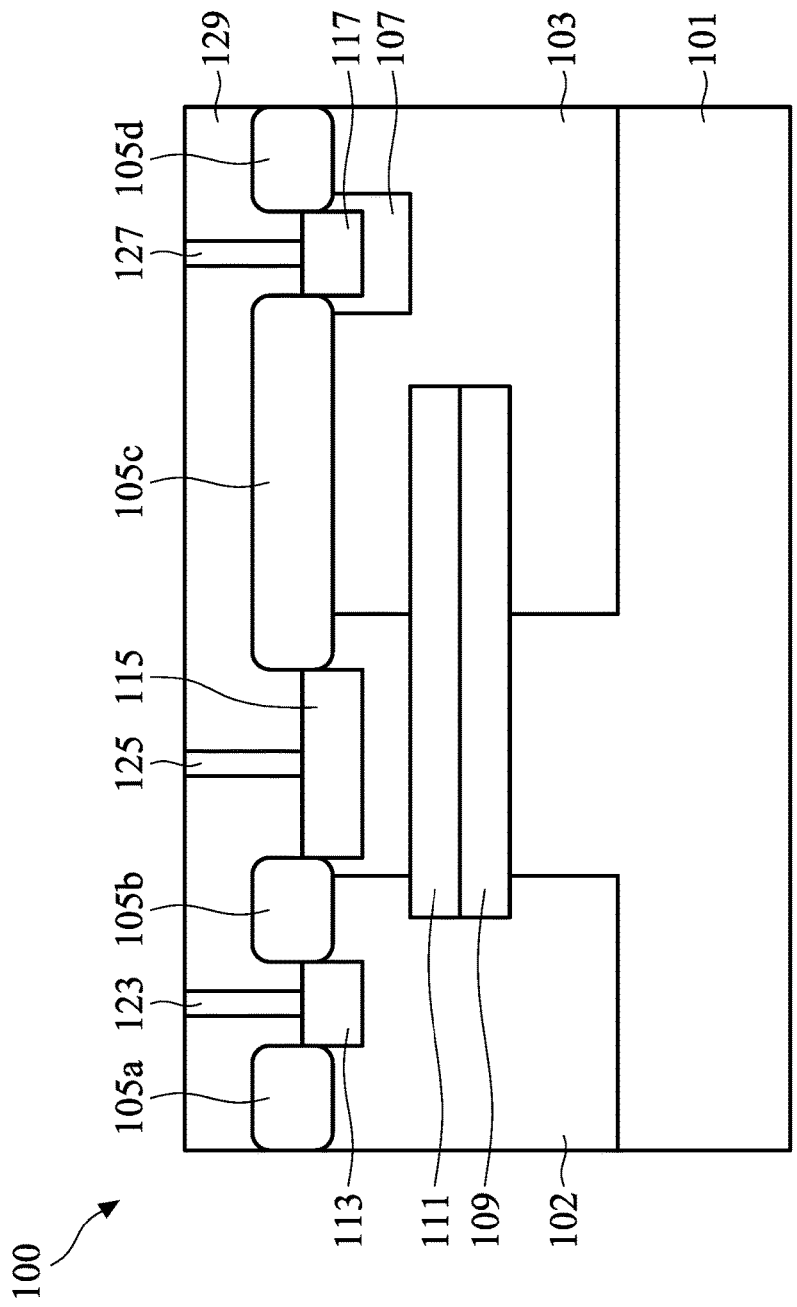

As shown in FIG. 6, an inter-layer dielectric (ILD) layer 129 is formed on the semiconductor substrate 101, and a source contact 123, a gate contact 125 and a drain contact 127 are formed penetrating through the inter-layer dielectric layer 129, in accordance with some embodiments. In some embodiments, the inter-layer dielectric layer 129 is made of silicon oxide, silicon nitride, phosphosilicate glass (PSG), borophosphosilicate glass (BPSG), and/or another applicable dielectric material. The inter-layer dielectric layer 129 may be formed by chemical vapor deposition (CVD), physical vapor deposition (PVD), atomic layer deposition (ALD), spin-on coating, or another applicable process.

After the inter-layer dielectric layer 129 is formed, the source contact 123, the gate contact 125 and the drain contact 127 are formed by performing an etching process on the inter-layer dielectric layer 129 to form trenches therein, and filling conductive materials into the trenches. Moreover, the source contact 123 is electrically connected to the source region 113, the gate contact 125 is electrically connected to the doped region 115, and the drain contact 127 is electrically connected to the drain region 117. In the present embodiment, the source contact 123, the gate contact 125, and the drain contact 127 are made of metal. In other embodiments, the source contact 123, the gate contact 125, and the drain contact 127 may comprise polysilicon or another suitable conductive material. Once the source contact 123, the gate contact 125, and the drain contact 127 are formed, the semiconductor device 100 is completed.

Figure 7:
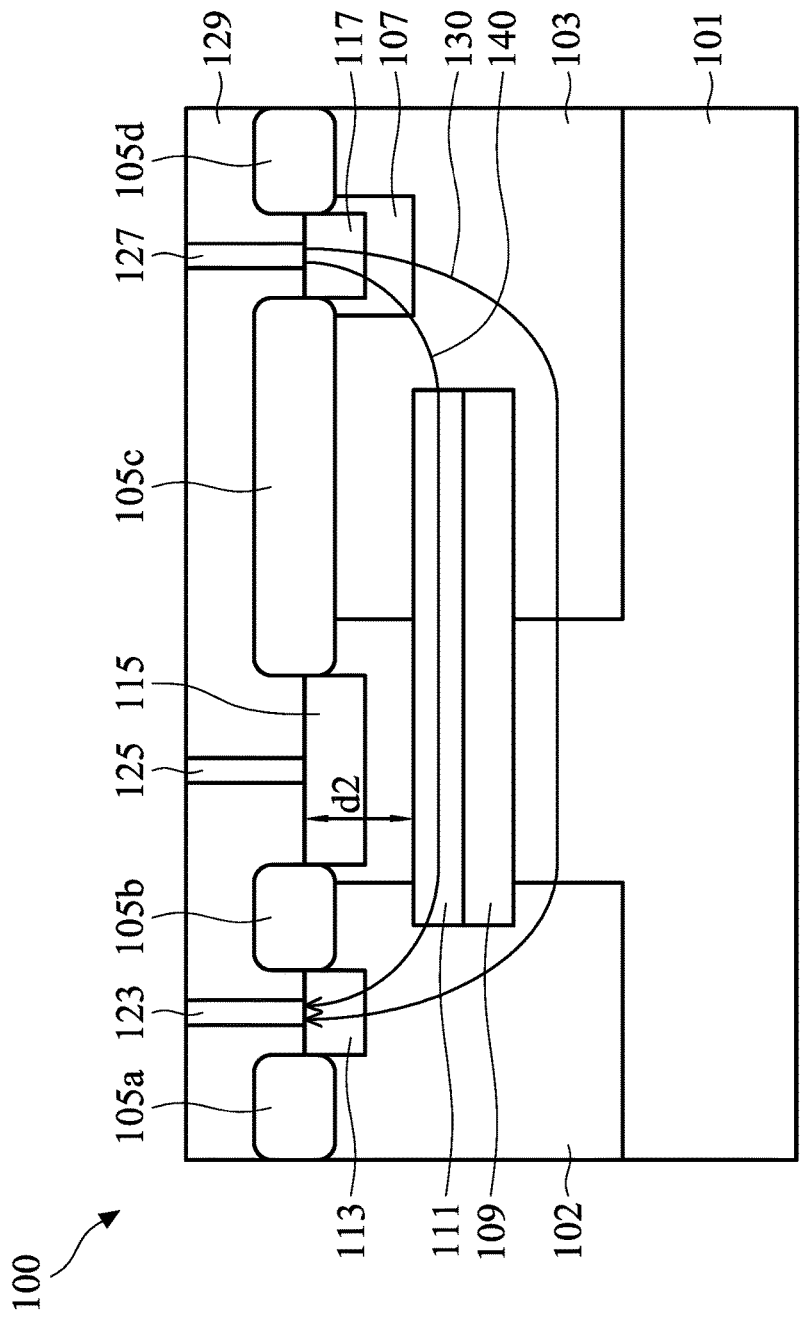
FIG. 7 is a cross-sectional view of a semiconductor device illustrating the channels induced when the device is operating in accordance with some embodiments.

FIG. 7 is a cross-sectional view of a semiconductor device illustrating the channels induced when the semiconductor device 100 is operating in accordance with some embodiments.

As shown in FIG. 7, when voltage is applied to the gate contact 125, a first channel 130 below the first top layer 109 and connecting the source contact 123 and the drain contact 127 is formed, and a second channel 140 across the second top layer 111 and connecting the source contact 123 and the drain contact 127 is formed.

By implanting two top layers, the first and second top layers 109 and 111, with opposite conductivity types in the semiconductor substrate 101 under the gate contact 125, the first and second channels 130 and 140 are induced in the semiconductor device 100. Therefore, the driving current of the semiconductor device 100, for example, a JFET, may be increased. Moreover, since the distance d2 between the second top layer 111 and the top surface of the semiconductor substrate 101 is small enough, for example from about 0.2 mm to about 1 mm, the pinch-off voltage of the semiconductor device 100 such as the JFET may be decreased.

In conclusion, in some embodiments of the present disclosure, two top layers with opposite conductivity types are formed between the source and drain regions of the semiconductor device, and a portion of the two top layers is formed directly under the gate region of the semiconductor device, which can increase the driving current and decrease the pinch-off voltage of the device without forming a well region under the gate region. Compared to the traditional manufacturing process, the embodiments of the present disclosure can form semiconductor devices, such as JFETs, that have both a high driving current and a low pinch-off voltage, without using additional masks for forming additional circuits for the device in the overall process.

The foregoing outlines features of several embodiments so that those skilled in the art may better understand the aspects of the present disclosure. Those skilled in the art should appreciate that they may readily use the present disclosure as a basis for designing or modifying other processes and structures for carrying out the same purposes and/or achieving the same advantages of the embodiments introduced herein. Those skilled in the art should also realize that such equivalent constructions do not depart from the spirit and scope of the present disclosure, and that they may make various changes, substitutions, and alterations herein without departing from the spirit and scope of the present disclosure.

What is claimed is:

1. A semiconductor device, comprising:
    a semiconductor substrate having a first conductivity type;
    a first well region and a second well region disposed in the semiconductor substrate, wherein the first well region and the second well region have a second conductivity type that is opposite to the first conductivity type;
    a first top layer disposed in the semiconductor substrate, wherein the first top layer extends from the first well region to the second well region, and the first top layer has the first conductivity type; and
    a second top layer disposed in the semiconductor substrate and on the first top layer, wherein the second top layer extends from the first well region to the second well region, and the second top layer has the second conductivity type.

2. The semiconductor device as claimed in claim 1, wherein the first well region and the second well region are separated by a distance, and the distance between the first well region and the second well region is greater than 0 μm and not exceeding 15 μm.

3. The semiconductor device as claimed in claim 1, wherein a first side of the first top layer and a first side of the second top layer are disposed in the first well region, and a second side opposite the first side of the first top layer and a second side opposite the first side of the second top layer are disposed in the second well region.

4. The semiconductor device as claimed in claim 1, further comprising:
    a source region disposed in the first well region, having the second conductivity type;
    a doped region disposed between the first well region and the second well region, having the first conductivity type; and
    a drain region disposed in the second well region, having the second conductivity type,
    wherein the first top layer and the second top layer are disposed between the source region and the drain region.

5. The semiconductor device as claimed in claim 4, further comprising:
    a third well region disposed in the second well region and having the second conductivity type, wherein the drain region is disposed in the third well region.

6. The semiconductor device as claimed in claim 4, further comprising:
    a source contact disposed on the source region;
    a gate contact disposed on the doped region; and
    a drain contact disposed on the drain region, wherein the source contact, the gate contact, and the drain contact are made of metal.

7. The semiconductor device as claimed in claim 6, wherein a voltage is applied to the gate contact, a first channel below the first top layer connecting the source contact and the drain contact is formed, and a second channel across the second top layer connecting the source contact and the drain contact is formed.

8. The semiconductor device as claimed in claim 4, wherein a first portion of the first top layer and a first portion of the second top layer are disposed directly below the doped region.

9. The semiconductor device as claimed in claim 8, wherein the second top layer and the doped region are separated by a portion of the semiconductor substrate.

10. The semiconductor device as claimed in claim 8, further comprising:
    a first isolation structure disposed between the source region and the doped region; and
    a second isolation structure disposed between the doped region and the drain region.

11. The semiconductor device as claimed in claim 10, wherein a second portion of the first top layer and a second portion of the second top layer are disposed directly below the first isolation structure, and a third portion of the first top layer and a third portion of the second top layer are disposed directly below the second isolation structure.

12. The semiconductor device as claimed in claim 10, wherein the second top layer and the first isolation structure are separated by a portion of the first wall region, and the second top layer and the second isolation structure are separated by a portion of the second well region.

13. A method for forming a semiconductor device, comprising:
    providing a semiconductor substrate having a first conductivity type;
    forming a first well region and a second well region in the semiconductor substrate, wherein the first well region and the second well region have a second conductivity type that is opposite to the first conductivity type;

forming a first top layer in the semiconductor substrate, wherein the first top layer is formed extending from the first well region to the second well region, and the first top layer has the first conductivity type; and forming a second top layer in the semiconductor substrate and on the first top layer, wherein the second top layer is formed extending from the first well region to the second well region, and the second top layer has the second conductivity type.

14. The method as claimed in claim 13, wherein the first well region and the second well region are formed separated by a distance, and the distance between the first well region and the second well region is in a range from 0 to 15 µm.

15. The method as claimed in claim 13, wherein the first top layer and the second top layer are respectively formed by performing a first ion implantation process and a second ion implantation process in the first well region, the second well region, and a portion of the semiconductor substrate between the first and second well regions.

16. The method as claimed in claim 13, further comprising:

forming a source region in the first well region, having the second conductivity type;

forming a doped region between the first well region and the second well region, having the first conductivity type; and forming a drain region in the second well region, having the second conductivity type, wherein the first top layer and the second top layer are formed between the source region and the drain region.

17. The method as claimed in claim 16, further comprising:

forming a third well region in the second well region, wherein the third well region has the second conductivity type, and the drain region is formed in the third well region.

18. The method as claimed in claim 16, further comprising:

forming a source contact on the source region;

forming a gate contact on the doped region; and forming a drain contact on the drain region.

19. The method as claimed in claim 16, further comprising:

forming a first isolation structure between the source region and the doped region; and forming a second isolation structure between the doped region and the drain region.

20. The method as claimed in claim 19, wherein the second top layer is formed below the first isolation structure, the doped region, and the second isolation structure, the second top layer and the first isolation structure are separated by a portion of the first wall region, and the second top layer and the second isolation structure are separated by a portion of the second well region.

* * * * *